United States Patent
Daghighian et al.

(10) Patent No.: US 8,750,714 B2
(45) Date of Patent: Jun. 10, 2014

(54) MONOLITHIC POWER MONITOR AND WAVELENGTH DETECTOR

(75) Inventors: Henry M. Daghighian, Mountain View, CA (US); Kevin J. McCallion, Charlestown, MA (US)

(73) Assignee: Finisar Corporation, Sunnyvale, CA (US)

( * ) Notice: Subject to any disclaimer, the term of this patent is extended or adjusted under 35 U.S.C. 154(b) by 195 days.

(21) Appl. No.: 13/316,272

(22) Filed: Dec. 9, 2011

(65) Prior Publication Data

US 2012/0082450 A1    Apr. 5, 2012

Related U.S. Application Data

(63) Continuation of application No. 12/026,368, filed on Feb. 5, 2008, now Pat. No. 8,078,063.

(51) Int. Cl.
*H04B 10/00* (2013.01)
(52) U.S. Cl.
USPC ............................. 398/138; 398/196; 398/197
(58) Field of Classification Search
USPC .................. 398/183, 196, 197, 200–207, 138
See application file for complete search history.

(56) References Cited

U.S. PATENT DOCUMENTS

| | | | | |
|---|---|---|---|---|
| 6,027,975 A | * | 2/2000 | Hergenrother et al. | 438/268 |
| 2004/0101009 A1 | * | 5/2004 | Johnson et al. | 372/45 |
| 2005/0046868 A1 | * | 3/2005 | Kim et al. | 356/519 |
| 2007/0172169 A1 | * | 7/2007 | Kish et al. | 385/14 |
| 2008/0089693 A1 | * | 4/2008 | El-Ahmadi et al. | 398/135 |

* cited by examiner

*Primary Examiner* — Dzung Tran
(74) *Attorney, Agent, or Firm* — Maschoff Brennan

(57) ABSTRACT

Monolithic single and/or dual detector structures are fabricated on the emitting surface of a VCSEL and/or on a lens or glass substrate configured to be positioned along the axis of emission of an optical light source. Each monolithic detector structure includes one or two PIN detectors fabricated from amorphous silicon germanium with carbon doping or amorphous germanium with hydrogen doping. The monolithic detectors may additionally include various metallization layers, buffer layers, and/or anti-reflective coatings. The monolithic detectors can be grown on 1550 NM VCSELs used in optical transmitters, including lasers with managed chirp and TOSA modules, to reduce power and real estate requirements of the optical transmitters, enabling the optical transmitters to be implemented in long-reach SFP+ transceivers.

20 Claims, 5 Drawing Sheets

MONOLITHIC POWER MONITOR AND WAVELENGTH DETECTOR

CROSS-REFERENCE TO RELATED APPLICATIONS

This application is a continuation of U.S. patent application Ser. No. 12/026,368 filed on Feb. 5, 2008, titled MONOLITHIC POWER MONITOR AND WAVELENGTH DETECTOR, the contents of the application is hereby incorporated herein by reference in its entirety.

BACKGROUND OF THE INVENTION

1. The Field of the Invention

The present invention relates generally to optoelectronic devices. More specifically, the present invention relates to monolithic single and dual detector structures for use with optoelectronic devices.

2. The Relevant Technology

Computing, telecom and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from modest Local Area Networks ("LANs") to backbones that define a large portion of the infrastructure of the Internet.

Typically, data transmission in such networks is implemented by way of an optical light source, such as a laser or Light Emitting Diode ("LED"). The optical light source emits light when current is passed through it, the intensity of the emitted light being a function of the magnitude of the current. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

In certain optical network applications, such as dense wavelength division multiplexing ("DWDM") networks, it may be desirable to monitor the optical output power and/or wavelength of light signals emitted by the optical light source. If the output power and/or emission wavelength are above or below a desired power and/or wavelength, a feedback loop can then be used to increase or decrease the appropriate parameter.

In a conventional monitoring arrangement used with edge emitting optical light sources (e.g., distributed feedback lasers, and the like), a power monitor photodiode is placed behind the back facet of the edge emitter. Although most of the light emitted by the edge emitter escapes through the front facet of the edge emitter, a proportional amount of light also escapes through the back facet. Some of the light emitted through the back facet is then absorbed by the power monitor photodiode, generating a current in the power monitor photodiode that is proportional to the absorbed light. The magnitude of the photocurrent generated by the power monitor photodiode can be used to measure the optical output power of the edge emitter.

The wavelength of the light emitted by the edge emitter can be measured using a beam splitter, a second monitor photodiode, and a narrow bandpass wavelength filter. The beam splitter is typically placed in front of the front facet of the edge emitter, allowing most of the light emitted by the edge emitter to pass through, while redirecting a proportional amount of the emitted light through the wavelength filter to the second monitor photodiode.

Similar to the power monitor photodiode, the second monitor photodiode generates a current proportional to the light absorbed by the second monitor photodiode. However, the amount of light that reaches the second monitor photodiode through the wavelength filter depends on both the initial optical output power (which can be measured by the power monitor photodiode) and the wavelength of the emitted light. The closer the emission wavelength is to the bandpass of the wavelength filter, the greater the amount of light that passes through the wavelength filter to the second monitor photodiode. Consequently, a ratio of the currents generated by the power monitor photodiode and the second monitor photodiode can be used to determine the wavelength of the light emitted by the edge emitter. In many cases, this determination is accomplished by looking up the ratio in a lookup table or calibration file.

Although beneficial for power and wavelength monitoring and control, conventional monitoring devices suffer from a number of disadvantages. First, conventional monitoring devices involve numerous discrete optical components that require significant real estate in an optical light source package. Additionally, the cost of the discrete optical components required for monitoring power and/or wavelength increases the material cost of optical light source packages in which they used. Moreover, the difficulties in properly aligning the discrete optical components increase the complexity and cost of manufacturing the optical light source packages that include such components.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF THE INVENTION

These and other limitations are overcome by embodiments of the invention which relate to systems and methods for monitoring the output power and/or wavelength of light emitted by an optical light source. Briefly summarized, embodiments of the invention are directed to a monolithic dual detector structure or separate monolithic detector structures occupying much less real estate than conventional discrete components used for power and/or wavelength monitoring. The monolithic detector structure(s) can be economically mass-produced using low-cost fabrication techniques on the emitting surface of a 1550 NM VCSEL transmitter, on an optical lens to be positioned in front of an optical light source, on a glass substrate to be positioned between an optical light source and an optical lens, or the like or any combination thereof.

In one embodiment, the dual monolithic detector structure includes two separate PIN detectors separated by a wavelength filter. Each of the PIN detectors may include an amorphous material such as amorphous silicon germanium with carbon doping or amorphous germanium with hydrogen doping, which can additionally be doped with phosphorus for enhanced responsivity. The amorphous material is selectively doped to form the PIN structure. Each PIN detector may further include metallization layers made of a transparent metal such as indium zinc oxide, indium tin oxide, or the like. It is appreciated that in this embodiment, additional calibration of the device may be required to account for back-reflected light from the wavelength filter influencing the response of the first monolithic photodetector in this particular embodiment.

The monolithic detector structure may further include a first buffer layer that is deposited on the VCSEL emitting surface, optical lens or glass substrate before forming the first PIN detector, and a second buffer layer that is deposited on the wavelength filter. The first and second buffer layers may include, for instance, polyimide, silicon oxide, or nitride. The monolithic detector structure may further include one or more anti-reflective coatings to reduce back reflections as light is received at the monolithic detector structure.

According to one embodiment, separate monolithic detector structures are implemented in a laser with managed chirp that includes an optical light source configured to emit light in the 1550 nanometer range, an optical spectrum reshaper, and the monolithic detector structures. Each of the optical light source and the optical spectrum reshaper are coupled to a different thermo electric cooler ("TEC") configured to control the respective temperatures of the optical light source and optical spectrum reshaper. The optical light source may comprise a 1550 NM VCSEL with the monolithic power detector structure grown on the emitting surface thereof and the monolithic wavelength detector structure grown on an optical lens following the optical spectrum reshaper. This enables a TEC driver to be integrated within the package of the laser with managed chirp. Further, because the laser with managed chirp uses a 1550 NM VCSEL, it can be implemented in a long reach SFP+ transceiver that includes a CDR for signal equalization.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Embodiments of the invention relate to systems and methods for providing optical power and/or wavelength monitoring in optoelectronic devices using monolithic single and/or dual detector structures. The monolithic detector structures according to embodiments of the invention can be fabricated in the emission path of a light source such as a vertical cavity surface emitting laser ("VCSEL"), a distributed feedback ("DFB") laser, and the like. In particular, a monolithic detector structure may be fabricated on the emitting surface of a VCSEL, on an optical lens following an optical light source, on a substrate between an optical light source and an optical lens, and the like or any combination thereof.

According to one embodiment, a dual detector structure is fabricated on the emitting surface of a 1550 NM VCSEL implemented within a conventional TOSA. Alternately or additionally, a monolithic power detector structure can be fabricated on the emitting surface of a VCSEL or on a first optical lens following a DFB laser, either of which can be implemented within a laser with managed chirp, while a monolithic wavelength detector structure may be fabricated on a second optical lens following the OSR of the laser with managed chirp. Embodiments of a laser with managed chirp will be described below.

Each detector structure can include single or dual detectors comprising one or more of amorphous silicon germanium with carbon doping (a-SiGe:C), and amorphous germanium with hydrogen doping (a-Ge:H); a-Ge:H detectors can additionally be doped with phosphorous for enhanced responsivity. The detector structures according to embodiments of the invention can be used with light sources emitting light at or around particular wavelengths and are substantially transparent to the emitted light. However, the coefficient of absorption of the detector structures is still high enough for the detector structures to capture some of the emitted light for monitoring purposes. Advantageously, the detector structures according to embodiments of the invention occupy less space and cost less money to fabricate than traditional power and wavelength detectors.

Figure 1:
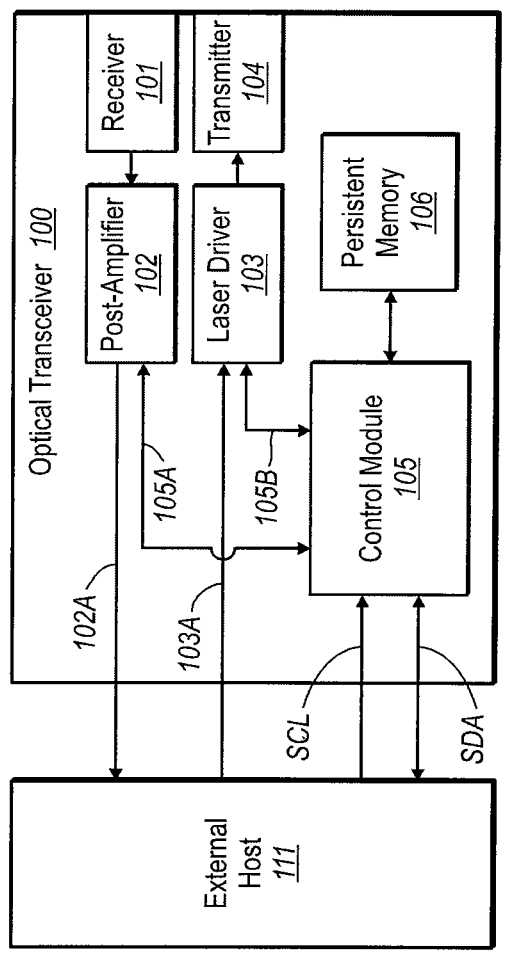
FIG. 1 schematically illustrates an example optical transceiver that may implement features of the present invention.

The present invention can be implemented in various optoelectronic devices. As used herein, the term "optoelectronic device" includes devices having both optical and electrical components. Examples of optoelectronic devices include, but are not limited to, transponders, transceivers, transmitters, and/or receivers. Optoelectronic devices can be used, for instance, in telecommunications networks, local area networks, metro area networks, storage area networks, wide area networks, and the like. The principles of the present invention may be implemented in optoelectronic devices of any form factor currently available or that may be developed in the future, including SFF, SFP, XFP, 300-pin, without restriction. It will be appreciated, however, that the optoelectronic devices need not comply with standardized form factor requirements and may have any size or configuration necessary according to a particular design. The principles of the present invention are suitable for 1G, 2G, 4G, 10G and higher bandwidth fiber channels FIG. 1 schematically illustrates an example optical transceiver module 100 in which the principles of the present invention may be employed. The optical transceiver 100 includes a receiver 101, post-amplifier 102, laser driver 103, transmitter 104, microcontroller 105, and persistent memory 106. The principles of the present invention enable the use of space- and cost-efficient detector structures to monitor the optical power and/or wavelength of light emitted by the light source 104. While the optical transceiver and the transmitter 104 will be described in some detail, they are described by way of illustration only, and not by way of restricting the scope of the invention.

In operation, the optical transceiver 100 receives an optical signal using optical receiver 101. The receiver 101 acts as an opto-electric transducer by transforming the optical signal into an electrical signal. The receiver 101 provides the resulting electrical signal to a post-amplifier 102. The post-amplifier 102 amplifies the signal and provides the amplified signal to a host 111 as represented by arrow 102A. The host 111 may be any computing system capable of communicating with the optical transceiver 100.

The optical transceiver 100 may also receive electrical signals from the host 111 for transmission as optical signals. Specifically, the laser driver 103 receives an electrical signal from the host 111, as represented by the arrow 103A, and drives the optical transmitter 104 to emit an optical signal. The transmitter 104 includes a suitable light source, such as a VCSEL, DFB laser, or the like, that is driven by the electrical signals provided by the host 111, thereby causing the light source to emit optical signals representative of the information carried in the electrical signal. Accordingly, the optical transmitter 104 serves as an electro-optic transducer.

The behavior of the optical receiver 101, the post-amplifier 102, the laser driver 103, and the optical transmitter 104 may vary dynamically due to a number of factors. For example, temperature changes, power fluctuations, and feedback conditions may each affect the performance of these components. Accordingly, the transceiver 100 includes a microcontroller 105, which may evaluate environment conditions, such as temperature, and/or operating conditions, such as emitted optical power and/or wavelength, and receive information from the post-amplifier 102 (as represented by arrow 105A) and from the laser driver 103 (as represented by arrow 105B). This allows the microcontroller 105 to optimize the dynamically varying performance of the transceiver 100. Specifically, the microcontroller 105 may optimize the operation of the transceiver 100 by adjusting settings on the post-amplifier 102 and/or the laser driver 103 as represented by the arrows 105A and 105B.

For instance, in one embodiment, the optical transceiver 100 is implemented in a network in which constant optical power, constant wavelength, or both, are desired for operation. For example, the optical transceiver 100 may be implemented in a network that uses dense wavelength division multiplexing ("DWDM") to couple light signals from multiple transmitters into a single optical fiber. In this case, maintaining the light signal emitted by the transceiver 100 at constant power and wavelength is critical to the proper operation of the DWDM network. Accordingly, the present embodiment uses a monolithic dual detector (or separate single detectors) to monitor optical power and wavelength of the emitted signal. In particular, the dual detector (or separate single detectors) generates two photocurrents indicative of the optical power and wavelength of the emitted signal. After determining values for these two photocurrents, the microcontroller 105 can use a lookup table or calibration file to determine the optical power and wavelength of the emitted signal. If the optical power and/or wavelength are not at the desired values, the microcontroller 105 can adjust settings on the laser driver 103 and/or transmitter 104 to correct either one or both.

The microcontroller 105 may have access to a persistent memory 106, which in one embodiment is an Electrically Erasable and Programmable Read Only Memory ("EEPROM"). Persistent memory 106 may also be any other nonvolatile memory source. The persistent memory 106 and the control module 105 may be packaged together in the same package or in different packages without restriction. In one embodiment, the persistent memory 106 stores the lookup table and/or calibration file for determining power and/or wavelength.

Data and clock signals may be provided from the host 111 to the microcontroller 105 using the serial clock line SCL, and the serial data line SDA. Also, data may be provided from the microcontroller 105 to the host 111 using the serial data line SDA. Alternately or additionally, any suitable interface may be implemented for communication between the host 111 and microcontroller 105, such as I$^2$C (as illustrated), MDIO, SPI, and the like or any combination thereof.

Figure 2A:
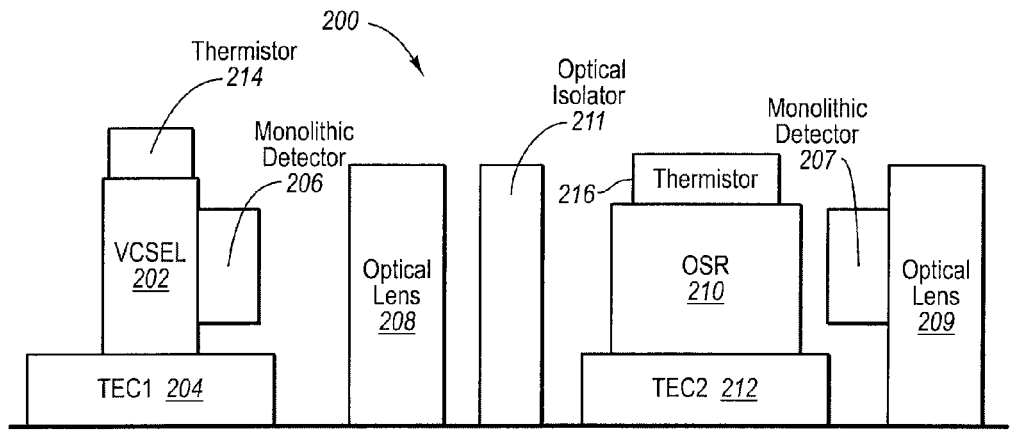
FIG. 2A schematically illustrates one embodiment of a laser with managed chirp that includes a 1550 NM VCSEL and incorporates separate VCSEL-mounted & lens-mounted monolithic detector structures for optical power and wavelength monitoring.

Turning now to FIG. 2A, one embodiment of an optical transmitter in simplified block form is illustrated that implements separate monolithic optical power and wavelength detectors according to the invention. As illustrated, the optical transmitter 200 comprises a laser with managed chirp, conventional embodiments of which are disclosed in U.S. patent application Ser. No. 10/289,944, filed Nov. 6, 2002 and entitled POWER SOURCE FOR A DISPERSION COMPENSATION FIBER OPTIC SYSTEM, which application is herein incorporated by reference in its entirety. Embodiments of a laser with managed chirp are marketed by the Finisar Corporation as Chirp Managed Laser CML™ transmitters.

Briefly, a conventional laser with managed chirp comprises a light source and an optical spectrum reshaper ("OSR") or optical discriminator and may optionally include one or more thermo electric coolers ("TECs"), thermistors, a beam splitter and two monitor photodiodes. An optical isolator is also often deployed before the OSR, depending on the reflection characteristics of the OSR. As will be described more fully below, the beam splitter and photodiodes may be required to monitor the power and wavelength of light emitted by the light source for proper functioning of the laser with managed chirp. However, these components require a significant amount of real estate in the package of the laser with managed chirp. Further, inclusion of these components in the package increases the cost of and complicates the package manufacturing process (e.g., these components must be manufactured/purchased and then be properly aligned within the package).

Accordingly, the transmitter 200 in the present embodiment includes first and second monolithic detector structures 206, 207 for optical power and wavelength monitoring, respectively, thereby eliminating the need for the discrete photodiode and beam splitter components. In more detail, and as illustrated, the optical transmitter 200 includes a 1550 NM VCSEL light source 202 coupled to a first thermo electric cooler ("TEC") 204 for temperature control of the VCSEL 202, with the first monolithic detector structure 206 grown on the emitting surface of the VCSEL 202. The transmitter 200 further includes a first optical lens 208 and optical spectrum reshaper 210 disposed along the axis of light emission of the VCSEL 202. The OSR 210 is additionally coupled to a second TEC 208 for temperature control of the OSR 210. A second optical lens 209 is disposed along the axis of light emission following the OSR 210. The second monolithic detector 207 is grown on the input surface of the second optical lens 209 and is used to monitor the transmitted optical power while the second lens 209 couples the light into optical fiber. In one embodiment, the OSR 210 comprises a multi-cavity etalon filter. Two thermistors 214, 216 may be provided for measuring the temperature of the VCSEL 202 and OSR 210, respectively.

As the name implies, a laser with managed chirp manages the chirp of an optical light source to optimize a signal produced by the light source. In particular, when a semiconductor light source, such as a VCSEL or DFB, is directly modulated, adiabatic chirp causes 1 bits to be blue-shifted relative to 0 bits. The optical transmitter 200 exploits the wavelength difference between the 1 bits and 0 bits to increase the extinction ratio of the light signal emitted by the VCSEL 202.

In particular, the extinction ratio of an emitted light signal can be increased using the OSR 210. The OSR 210 is a filter with a transmission window configured to discriminate between blue-shifted 1 bits and red-shifted 0 bits. Consequently, the OSR 210 can transmit 1 bits with little or no loss while attenuating 0 bits to increase the extinction ratio of the signal.

Advantageously, adiabatic chirp, together with the OSR 210, introduces phase correlation between the bits, which increases dispersion tolerance and reduces the information bandwidth by a factor of two. Consider a "1 0 1" bit sequence at 10G where 1 bits have 5 GHz higher frequency than 0 bits. The phase of the carrier slips by $2\pi \times 5$ GHz$\times 100$ ps$=\pi$ during the 0 bit, making the second 1 bit it out of phase with the first. Normally dispersion closes the eye by spreading the energy of the 1 bits into adjacent 0 bits. Here, the 1 bits interfere destructively in the middle 0 bit because of the it phase shift, keeping the eye open after fiber propagation.

The VCSEL 202 and OSR 210 are active elements that vary in temperature during operation. In the case of the VCSEL 202, variations in temperature cause changes to the wavelength of light signals emitted by the VCSEL 202. In the case of the OSR 210, temperature variations cause changes to the OSR's transmission window. As a result, proper operation of the optical transmitter 200 can require matching the emission wavelength of the VCSEL 202 to the transmission window of the OSR 210. In addition to matching the emission wavelength to the transmission window, it may be necessary to maintain the emitted light at constant power and wavelength. To this end, the optical transmitter 200 includes TECs 204, 212 for controlling the temperatures of the VCSEL 202 and OSR 210, and the monolithic detector structures 206, 207 for measuring the output power and wavelength of emitted light.

As previously indicated, the first detector structure 206 is configured to monitor optical power and the second detector structure 207 is configured to monitor wavelength in conjunction with the OSR, the OSR comprising a periodic structure. In another embodiment, the first and second detectors can be jointly implemented in a monolithic dual detector structure that includes a periodic structure separate from the OSR. The first and second detectors are made from materials suited for light in the 1550 NM range, which includes light from 1520 NM to 1570 NM (generally referred to herein as "1550 NM light"). Consequently, the two detectors are substantially transparent to 1550 NM light, although they have coefficients of absorption for 1550 NM light that are high enough to capture a small amount of the emitted light and produce photocurrents representative thereof. The periodic structure—whether included in the OSR and/or in a dual monolithic detector structure—is attuned for a particular wavelength in the 1550 NM range. The transmissivity of the OSR/periodic structure depends on the emission wavelength and is most transmissive for light at the particular wavelength.

When light is emitted by the VCSEL 202, it passes through the first and second detector structures 206, 207. In particular, upon passing through the first detector 206, the first detector generates a photocurrent representative of the optical power of the emitted light. The emitted light then propagates through the first optical lens 208 before propagating towards the OSR 210. The optical transmitter 200 may optionally include an optical isolator component 211 through which the light propagates before propagating through the OSR 210. Light emerging from the OSR 210 then passes through the second monolithic detector 207 before the second optical lens 209 focuses the light into an optical fiber.

Because the OSR 210 (or other periodic structure) is attuned to a particular wavelength, the amount of light that propagates through the OSR depends on the wavelength of the light signal. Accordingly, the second detector 207 also generates a photocurrent, the magnitude of which depends on both the initial optical power and the wavelength of the emitted light signal. In one embodiment of the invention, the photocurrents from the first and second detectors can be provided to a microcontroller which can determine the emission wavelength using a lookup table and the photocurrents.

Figure 2B:
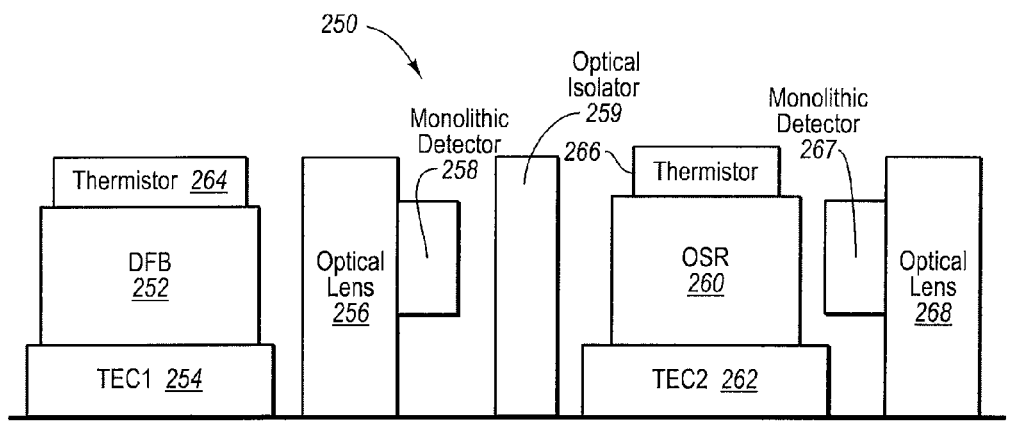
FIG. 2B schematically illustrates a second embodiment of a laser with managed chirp that includes a DFB laser and incorporates separate lens-mounted monolithic detector structures for optical power and wavelength monitoring.

FIG. 2B illustrates a second embodiment of an optical transmitter 250—also comprising a laser with managed chirp—that implements separate monolithic optical power and wavelength detectors according to embodiments of the invention. The transmitter 250 is similar in many respects to the transmitter 200 of FIG. 2A. In particular, the transmitter 250 includes a light source 252 coupled to a first TEC 254, a first optical lens 256, a first monolithic detector structure 258, an optional optical isolator 259, an OSR 260 coupled to a second TEC 262, two thermistors 264, 266, a second monolithic detector structure 267, and a second optical lens 268. However, in the embodiment of FIG. 2B the light source 252 comprises a DFB laser and the first detector structure 258 is grown on the first lens 256, rather than on the light source 252. The operation of the optical transmitter 250 is similar to that of the transmitter 200 and can be understood with reference to the explanation provided above with regard to the transmitter 200.

Figure 2C:
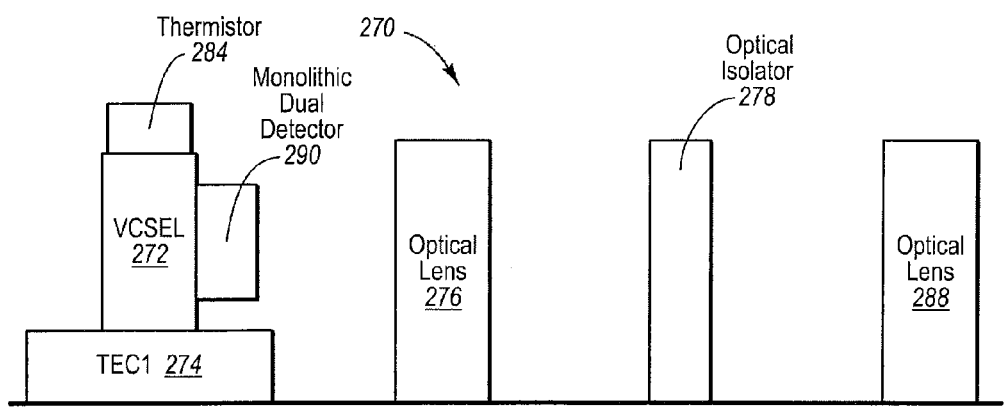
FIG. 2C schematically illustrates a conventional transmitter optical subassembly ("TOSA") that includes a 1550 NM VCSEL and incorporates a VCSEL-mounted monolithic dual detector structure for both optical power and wavelength monitoring.

FIG. 2C illustrates a third embodiment of an optical transmitter 270—comprising a TOSA—that implements a monolithic dual detector structure according to embodiments of the invention. The TOSA 270 is similar in some respects to the transmitter 200 of FIG. 2A. For instance, the TOSA 270 includes a VCSEL light source 272 coupled to a TEC 274, a first optical lens 276, an optional optical isolator 278, a thermistor 284, and a second optical lens 288. However, in the embodiment of FIG. 2C the transmitter 270 lacks an OSR, second thermistor, and second TEC. Additionally, the transmitter 270 includes a dual power and wavelength detector structure 290 on the surface of the VCSEL 272 rather than having separate power and wavelength detector structures on the VCSEL 272 and second lens 288, respectively, as in the embodiment of FIG. 2A. Embodiments of a dual power and wavelength detector structure are described in greater detail below with respect to FIGS. 3A and 3B.

In the embodiment of FIG. 2C, the dual detector 290 includes a periodic structure attuned to a particular wavelength of 1550 NM light. The periodic structure is sandwiched between a power detector at the input of the dual detector 290 and a wavelength detector at the output of the dual detector 290. Consequently, when 1550 NM light is emitted by the VCSEL 272, the power detector generates a photocurrent representative of the optical power of the emitted light, while the wavelength detector generates a photocurrent representative of the wavelength of the emitted light. As in the embodiments already described, the photocurrents from the power and wavelength detectors can be provided to a microcontroller and used to determine the optical power and wavelength of the emitted light.

It is appreciated that the embodiments of FIGS. 2A-2C are illustrative only and that variations are contemplated to be within the scope of the invention. For instance, while the monolithic single and/or dual detector structures have been illustrated and described as being grown on a VCSEL's emitting surface and/or on one or more lenses implemented in conjunction with a laser with managed chirp, the detector structures could alternately or additionally be grown on other optical lenses in conjunction with a laser with managed chirp or other optical transmitters, on glass substrates placed between optical lenses and DFB, VCSEL, or other light sources, and the like or any combination thereof.

In one embodiment of the invention, monolithic single or dual detector structures enable a 1550 NM VCSEL light source to be implemented in applications that incorporate a laser with managed chirp as a low power alternative to a DFB laser for use in small form factor platforms such as SFP+. In particular, VCSELs require about 30 mA for operation compared to about 120 mA for a DFB laser. Advantageously, the reduced power requirements of a VCSEL increase the remaining power budget for the transceiver as a whole. In one embodiment, the increased remaining power budget can be used to operate a CDR for electrical signal equalization on the transmit side of the transceiver, enabling use of the optical transceiver in long reach applications. Further, as will be explained in the following paragraphs, use of monolithic single or dual detector structures vacates real estate within the laser with managed chirp, which ultimately results in room becoming available for the CDR within the transceiver.

As already mentioned above, replacing the discrete components used for power and wavelength monitoring with monolithic single or dual detector structures vacates real estate in an optical transmitter package for a laser with managed chirp (or other optical package, such as a TOSA). Thus, the size of the transmitter package can be reduced. Alternately or additionally, the vacated real estate can be used for an integrated TEC driver or other components. Embodiments of a TOSA with an integrated TEC driver are described in U.S. Provisional Patent Application Ser. No. 60/986,356, filed Nov. 8, 2007 and entitled TRANSMITTER OPTICAL SUB-ASSEMBLY WITH INTEGRAL THERMOELECTRIC COOLER DRIVER, which is herein incorporated by reference in its entirety. While the 60/986,356 application discusses integration of the TEC driver within a TOSA, the principles of that invention can alternately or additionally be applied to integrate the TEC driver inside a laser with managed chirp as well.

In any event, placing the TEC driver inside the laser with managed chirp (or TOSA), rather than in its conventional location on the printed circuit board ("PCB") of the transceiver, vacates room on the PCB for the CDR. Alternately or additionally, the size of the package for the laser with managed chirp can be reduced, allowing the PCB to be enlarged to accommodate the CDR. In conclusion, then, use of a VCSEL with monolithic single or dual detector structures inside a laser with managed chirp or a TOSA vacates real estate within and reduces power requirements of the laser with managed chirp or TOSA, thereby enabling placement and operation of a CDR inside an SFP+ transceiver while still meeting the size and power budget requirements of the SFP+ form factor.

Alternately or additionally, monolithic single or dual detector structures can be implemented inside a laser with managed chirp, TOSA, or TOSA-like device that includes one or more integrated electronic components such as a CDR, driver, and microcontroller. Embodiments of a TOSA-like device that includes one or more integrated electronic components are described more fully in U.S. patent application Ser. No. 11/968,581, filed Jan. 2, 2008, and entitled INTELLIGENT TRANSMITTER MODULE, which application is herein incorporated by reference in its entirety.

Figure 3A:
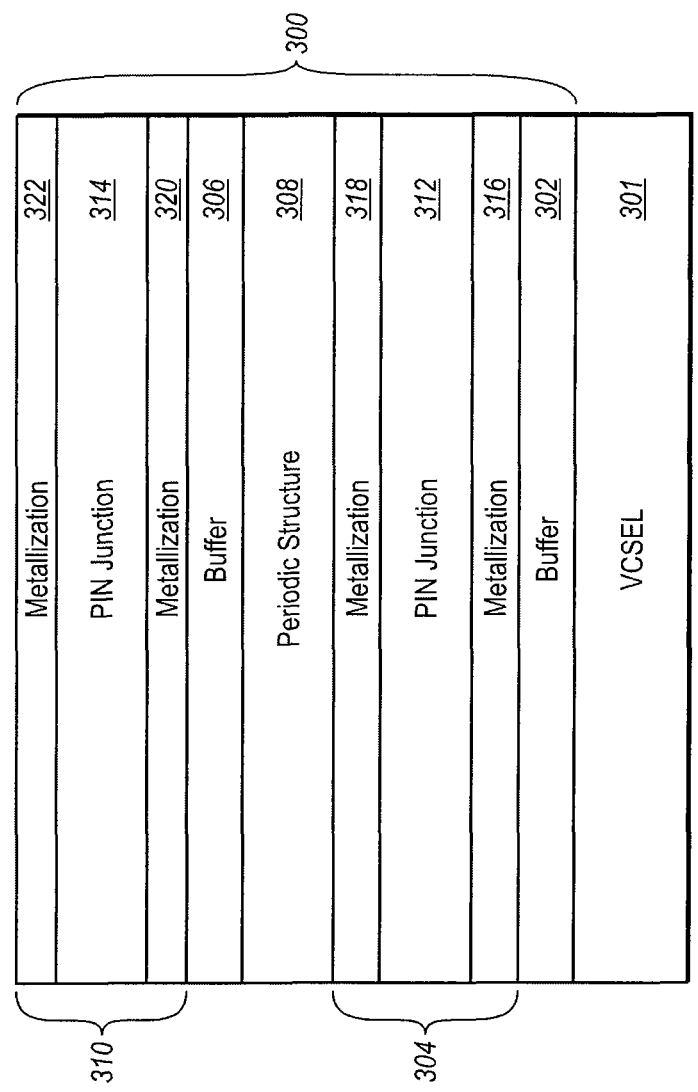
FIGS. 3A and 3B schematically illustrate embodiments of a monolithic dual detector structure according to the invention that are fabricated on a 1550 nm VCSEL.

With reference now to FIG. 3A, one embodiment of a monolithic dual detector structure 300 is illustrated, which may correspond to the monolithic dual detector 290 of FIG. 2C. The detector structure 300 can be fabricated on a VCSEL emitter surface or on a glass substrate such as a lens using low temperature deposition techniques including plasma enhanced chemical vapor deposition ("PECVD") and/or metal organic CVD ("MOCVD"). FIG. 3A illustrates a cross-sectional simplified block diagram of one monolithic dual detector structure 300. It is appreciated, however, that such structures can be mass produced using well-known fabrication techniques.

As shown, the detector structure 300 is fabricated or grown on the emitting surface of a VCSEL 301. However, the detector structure can alternately be grown on a glass substrate for placement along the axis of emission of a light source between the light source and an optical lens, or along the axis of emission on the optical lens itself.

The detector structure 300 includes a first buffer layer 302, a first detector 304 on the first buffer layer 302, a periodic structure 308 on the first detector 304, a second buffer layer 306 on the periodic structure 308, and a second detector 310 on the second buffer layer 306. The first detector 304 comprises a PIN layer or junction 312 and metallization layers 316 and 318 while the second detector 310 comprises a PIN layer or junction 314 and metallization layers 320 and 322. Note that the periodic structure 308 acts as the OSR described in FIGS. 2A-2B with respect to the wavelength detecting function.

In one embodiment, the monolithic detector structure 300 may be mass-produced on a wafer of 1550 NM VCSELs (or on a glass substrate or wafer of lenses) as follows. First, the wafer 301 is masked for deposition of a first buffer layer 302 on the surface of the VCSEL wafer 301. Alternately or additionally, when the detector structure 300 is grown on a lens or glass substrate, deposition of the first buffer layer 302 can be omitted. The first buffer layer 302 may comprise polyimide, silicon oxide, nitride, or some other inert buffer material. The mask pattern ensures that the polyimide 302 is only deposited on areas of the surface of the wafer that are above the active region of each VCSEL in the wafer. The wafer is masked again and a transparent metal contact 316, such as indium zinc oxide ("IZO"), indium tin oxide ("ITO"), or the like, is deposited on the buffer layer 302. It is understood that this and other metallization layers described herein are thin and comprise transparent metal, such as IZO or ITO, to avoid interfering with transmission of light through the detector structure 300.

A PIN layer or junction 312 is next deposited on the metallization layer 316 using a low temperature deposition technique, such as PECVD. According to embodiments of the invention, the PIN layer or junction comprises a-SiGe:C, or a-Ge:H that is selectively doped to create the PIN structure 312. The PIN layer or junction 312 may optionally be doped further with phosphorous to enhance responsivity. Note that the second detector 310 comprises the same material as the first detector 304 and may be fabricated in the same way.

Advantageously, the amorphous nature of these materials allows fabrication of the monolithic detector structure 300 on various surfaces such as semiconductor, glass, kapton, and the like.

In addition, the optoelectronic properties of a-SiGe:C and a-Ge:H make them suitable for use with 1550 NM light sources. In particular, the photovoltaic response of these materials is relatively weak in the 1550 NM range (e.g., 1520-1570 NM). However, in applications involving VCSELs with typical unattenuated output power on the order of a few milliwatts per element, enough photocurrent (on the order of 100 nanoamps) is generated for use as an optical power monitor. The typical output power of DFB lasers is even greater. Consequently, at the emission wavelengths of the devices being monitored, most of the light will be transmitted through the PIN layer 312, with a small portion absorbed and converted into photocurrent for monitoring the output power of the devices.

The PIN layer or junction 312 consists of an n-doped layer and a p-doped layer with a layer of the PIN junction 312 remaining undoped. Although described as a PIN junction with the undoped layer being the intrinsic layer, the layer 312 could also be classified as a p/n junction structure as the undoped layer in between the n+ doped layer and the p+ doped layer is a depletion region.

After depositing and processing the PIN layer 312, a second metallization layer 318 is deposited thereon to complete the first detector structure 304. The first detector structure 304 is followed by periodic structure 308 comprising multiple periodic layers of oxide materials.

The periodic structure 308 is formed in the shape of a distributed bragg reflector ("DBR") mirror, an etalon, or the like, to function as a fine-tuned wavelength filter (and as an OSR in some embodiments such as FIG. 4 below). Those of skill in the art will appreciate, with the benefit of the present disclosure, that the thickness of each of the multiple periodic layers of the periodic structure 308 determines the wavelength bandpass of the periodic structure 308. Consequently, the periodic structure 308 can be tuned to a particular wavelength bandpass by using an appropriate thickness for each of the multiple periodic layers.

After completing the periodic structure 308, the second detector 310 can be fabricated in the same manner and from the same materials as the first detector 304 using low temperature PECVD or some other low temperature deposition technique. In one embodiment, a second buffer layer 306 comprising polyimide, silicon nitride, silicon dioxide, or another inert material is deposited between the periodic structure 308 and the second detector 310. Finally, P and N contacts for each of the detectors can be formed by channeling thru dielectrically isolated trenches, with the metal contacts being formed on heavily doped channels.

One skilled in the art will appreciate, with the benefit of the present disclosure, that separate monolithic power and wavelength detectors can be fabricated using the methods and materials described above with respect to FIG. 3A. Separate power and wavelength detectors can be implemented in the embodiments of FIGS. 2A and 2B. For instance, the power detector 206 of FIG. 2A can be fabricated by deposition of a first buffer layer 302 on a VCSEL wafer followed by deposition of a first metallization layer 316. The first metallization layer 316 can be followed by a PIN layer or junction 312 and then a second metallization layer 318. The deposition of the periodic structure 308, second buffer layer 306, and second detector 310 can be omitted in this embodiment, as the wavelength detecting function is provided by the OSR 210 and separate wavelength detector 207.

The wavelength detector 207 of FIG. 2A can be fabricated by deposition of a first metallization layer 320 on an optical lens wafer, followed by a PIN layer or junction 314 and a second metallization layer 322. The deposition of the second buffer layer 306 can be omitted in some embodiments as the first metallization layer 320 can be deposited directly on the optical lens wafer depending on the lens material. Additionally, the power detector 304 can be omitted as the power detecting function is provided by the power detector 206, and deposition of the periodic structure 308 can be omitted since the OSR 210 includes a periodic structure.

Figure 3B:
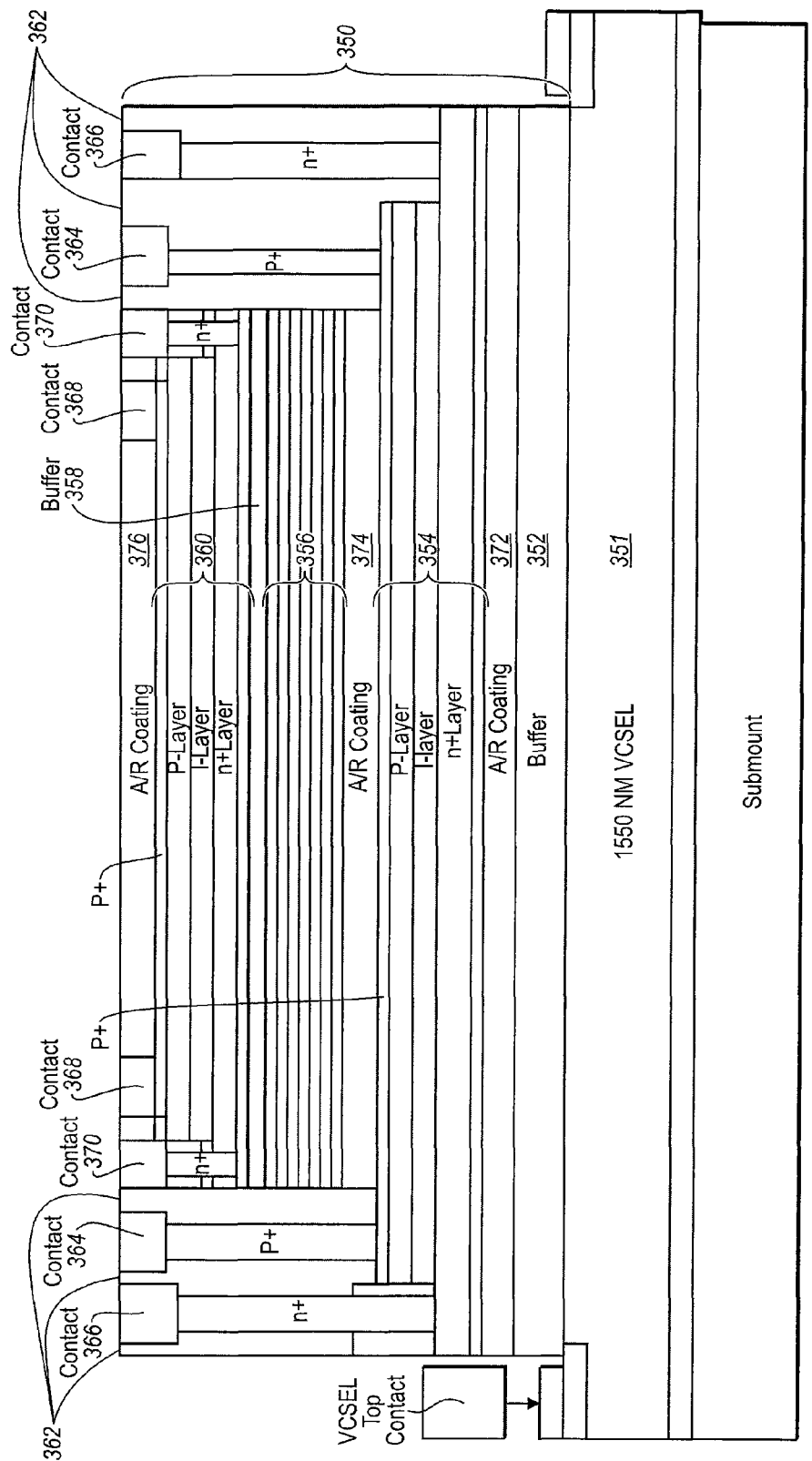

FIG. 3B illustrates a more detailed cross-sectional view of a monolithic dual detector structure 350 that may correspond to the monolithic dual detector structure 300 of FIG. 3A. In particular, the monolithic dual detector structure 350 is grown on a 1550 NM VCSEL 351 and includes a first buffer layer 352, first detector 354, periodic structure 356, second buffer layer 358, and second detector 360. The view of FIG. 3B further illustrates isolating dielectric 362 as well as the contacts for each of the detectors, including P contact 364 and N contact 366 for the first detector 354, and P contact 368 and N contact 370 for the second detector 360. As shown, the P and N contacts 364, 366, 368, 370 are formed on heavily doped channels through the isolating dielectric 362. The monolithic detector structure 350 additionally includes anti-reflective ("AIR") coatings 372, 374, and 376 to reduce back reflections as light propagates through the monolithic detector structure 350. As shown, the A/R coatings have been deposited between the first buffer layer 352 and first detector 354, between the first detector 354 and the periodic structure 356, and on top of the second detector 360.

As with FIG. 3A, the methods and materials discussed with respect to FIG. 3B can be used to fabricate separate power and wavelength detector structures. For instance, the power detector structure 206 grown on the VCSEL 202 of FIG. 2A might include a buffer layer 352, first A/R coating 372, power detector 354, second A/R coating 374, and P and N contacts 364, 366. Alternately or additionally, the wavelength detector structure 207 grown on the optical lens 209 of FIG. 2A might include a wavelength detector 360, A/R coating 376, and P and N contacts 368, 370.

One of skill in the art will appreciate, with the benefit of the present disclosure, that the monolithic dual detector structures 300, 350 and/or separate monolithic power and wavelength detector structures described herein can be used as wavelength lockers. In particular, after fabrication, a monolithic dual detector structure 300, 350 on a 1550 NM VCSEL (or on a lens or other glass substrate) or separate monolithic power and wavelength detectors can be calibrated to create a lookup table or calibration file that can be stored in memory of an optical transceiver or transponder in which the monolithic dual detector structure 300, 350 or separate power and wavelength detector structures are implemented. During operation, the light source emits light which propagates through the first detector 304, 354 and second detector 310, 360 where some of the light is absorbed and converted to photocurrents by the first and second detectors. A microcontroller or other component uses a ratio of the two photocurrents to determine the wavelength of the emitted light by reference to the lookup table or calibration file. If the wavelength is above or below a desired wavelength, the microcontroller provides feedback to a temperature control system (e.g., first and/or second TECs 204, 212 illustrated in FIG. 2A) to increase or decrease the temperature of the light source (and/or the OSR in a laser with managed chirp), which results in an increase or decrease in the wavelength of the emitted light.

Alternately or additionally, the photocurrent from the first detector 304, 354 can be used to control the output power of the emitted light. In this example, the photocurrent from the first detector 304, 354 is provided to a microcontroller or other control system. If the photocurrent is above or below a particular value (corresponding to a desired optical output power), the microcontroller can increase or decrease the laser bias current to increase or decrease the optical output power.

In one embodiment of the invention, the periodic structure 308, 358 of the monolithic detector 300, 350 is adapted to function as a variable optical attenuator ("VOA"). In this embodiment, metallization layers and electrical contacts are provided for the periodic structure 308, 358, similar to the metallization layers and electrical contacts provided for the first and second detectors. In this case, the application of a voltage or current to the periodic structure 308, 358 causes a dielectric change to the multiple periodic layers of the periodic structure 308, 358. By changing the dielectric function of the periodic structure, the periodic structure is made more or less transmissive, permitting more or less of an emitted optical signal to pass through the monolithic detector structure 300, 350. Thus, an electrically controlled periodic structure 308, 358 within a monolithic detector 300, 350 can be used to variably attenuate emitted optical signals.

To control the VOA periodic structure 308, 358, control lines can be provided from the electrical contacts to a microcontroller or other control components. In the case of the transceiver of FIG. 1, the host can communicate VOA instructions over the I$^2$C interface to the microcontroller, and the microcontroller can then apply a current or voltage to the control lines to change the dielectric function of the periodic structure and attenuate the emitted optical signal.

Advantageously, the electrically controlled VOA periodic structure enables changing the optical output power of a transmitter without changing the potential performance of the transmitter. For instance, one method known in the art for changing the optical output power of a transmitter is to reduce the bias current. However, this method changes the potential performance of the transmitter. According to the present embodiment, however, the performance of the transmitter can remain constant while the transmissivity of the periodic structure is changed in order to attenuate the emitted optical signal.

Figure 4:
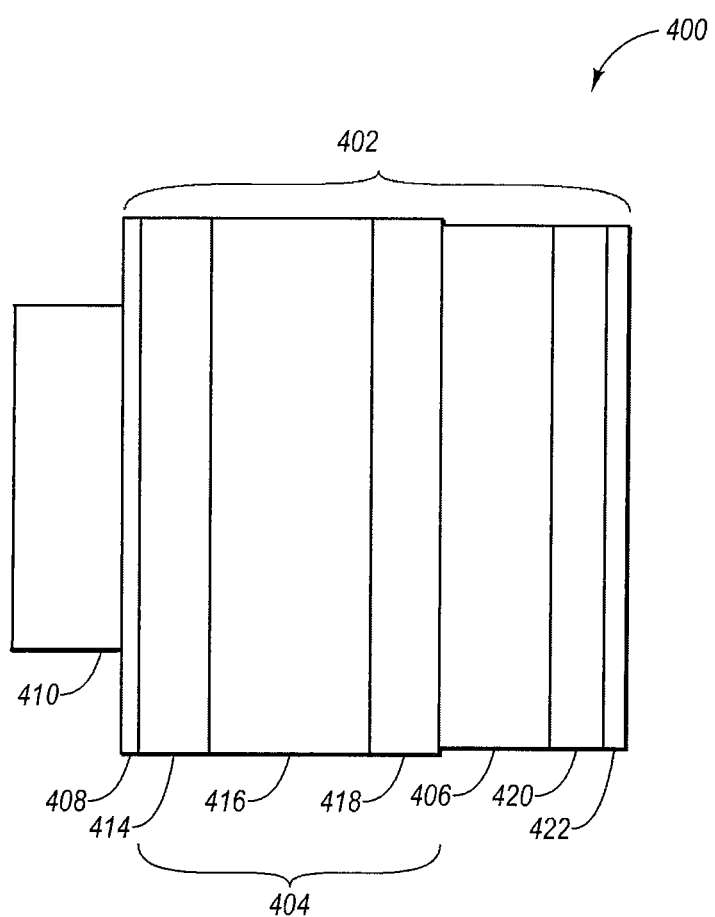
FIG. 4 schematically illustrates one embodiment of a compact laser with managed chirp that incorporates a monolithic optical filter sandwiched within a monolithic dual detector structure according to the invention.

Turning now to FIG. 4, one embodiment of a compact, hybrid integration, laser with managed chirp 400 is depicted that includes a dual detector structure 402 in a design that also incorporates an optical isolator 404 and collimating lens 406 for higher performance applications. In this assembly, a monolithic power detector 408 is located directly on the surface of a VCSEL 410 and is additionally bonded to an isolator subassembly 404 that includes a first linear polarizer 414, latched garnet Faraday rotator 416, and second linear polarizer 418. The second polarizer 418 is further bonded to a doped glass plate 406 configured to act as an integrated collimating lens, followed by a thin film bandpass filter or periodic structure 420. At the output of the filter 420, a monolithic wavelength detector 422 is deposited to allow wavelength locking control. Van der Vaals bonding can be used at each interface where discrete components are attached. Alternatively, thin epoxy bonding can be used. In the present embodiment, the periodic structure 420 provides equivalent functionality to the OSR 210, 260 of FIGS. 2A-2B, including the facilitation of wavelength detecting, discrimination between 0 bits and 1 bits, and other OSR functionality described above. Advantageously, the embodiment 400 of FIG. 4 enables simpler calibration and higher optical performance than the monolithic dual detector structures 300, 350 of FIGS. 3A and 3B due to inclusion of the isolator element 404.

As previously explained, separate monolithic detector structures can be grown that include only one detector for monitoring either optical power or wavelength. In the case of a monolithic detector structure for monitoring only wavelength, a periodic structure may also be included, or the periodic structure can be omitted in embodiments such as FIGS. 2A and 2B where a periodic structure is provided as part of another component (such as an OSR) positioned in front of the wavelength detector.

The embodiments described herein may include the use of a special purpose or general-purpose computer including various computer hardware or software modules, as discussed in greater detail below.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical transmitter incorporating monolithic detector structures for power and wavelength monitoring, the transmitter comprising:

an optical light source configured to emit light in an optical wavelength range through an emitting surface, the optical light source being coupled to a first thermoelectric cooler configured to control the temperature of the optical light source, wherein a change in the temperature of the optical light source results in a change in the wavelength of light emitted by the optical light source;

a first monolithic detector structure coupled to the emitting surface of the optical light source and being positioned along the emission axis of the optical light source and configured to detect optical output power of light emitted by the optical light source;

a periodic structure positioned along the emission axis of the optical light source following the first monolithic detector structure, the periodic structure being attuned to a particular wavelength within the optical wavelength range such that the periodic structure is substantially transmissive for light of the particular wavelength and variably less transmissive for light of different wavelengths outside of the optical wavelength range; and a second monolithic detector structure positioned along the emission axis of the optical light source following the periodic structure and configured to detect the wavelength of light emitted by the optical light source.

2. The optical transmitter of claim 1, wherein the periodic structure is included within an optical spectrum reshaper coupled to a second thermoelectric cooler configured to control the temperature of the optical spectrum reshaper, wherein a change in the temperature of the optical spectrum reshaper results in a change of the bandpass of the optical spectrum reshaper and the particular wavelength to which the periodic structure is attuned.

3. The optical transmitter of claim 1, wherein the second monolithic detector structure is coupled to
an optical lens following the optical spectrum reshaper.

4. The optical transmitter of claim 1, wherein the optical light source comprises a vertical cavity surface emitting laser and wherein the first monolithic detector structure is fabricated on the emitting surface of the vertical cavity surface emitting laser along the axis of light emission, wherein a buffer layer is located between the emitting surface and first monolithic detector, the first monolithic detector comprising:
a first metallization layer on the buffer layer;
a PIN layer or junction on the first metallization layer; and
a second metallization layer on the PIN layer or junction; and the second monolithic detector comprising:
a first metallization layer on the optical lens or on an a buffer layer between the optical lens and first metallization layer;
a PIN layer or junction on the first metallization layer; and
a second metallization layer on the PIN layer or junction.

5. The optical transmitter of claim 4, wherein the optical transmitter is implemented in an SFP+ form factor optical transceiver that includes a transmit CDR chip for electrical signal equalization.

6. The optical transmitter of claim 1, further comprising an optical lens disposed between the optical light source and the periodic structure, wherein the axis of light emission of the optical light source passes through the optical lens.

7. The optical transmitter of claim 6, wherein the optical light source comprises a vertical cavity surface emitting laser or a distributed feedback laser and wherein the optical wavelength range is between 1520 nanometers and 1570 nanometers.

8. The optical transmitter of claim 1, wherein the first and second monolithic detector structures include one or more of: amorphous silicon germanium with carbon doping, and amorphous germanium with hydrogen doping.

9. The optical transmitter of claim 1, wherein photocurrents generated by the first and second monolithic detector structures are used in a feedback loop to determine and adjust an emission wavelength of the light emitted by the optical light source.

10. The optical transmitter of claim 1, further comprising a lookup table or calibration file indicative of the wavelength of light emitted by the optical light source depending on a ratio of photocurrents generated by the first and second monolithic detector structures.

11. An optical transmitter incorporating monolithic detector structures for power and wavelength monitoring, the transmitter comprising:

an optical light source configured to emit light in an optical wavelength range through an emitting surface, the optical light source being coupled to a first thermoelectric cooler configured to control the temperature of the optical light source, wherein a change in the temperature of the optical light source results in a change in the wavelength of light emitted by the optical light source;

a first optical lens positioned long the emission axis of the optical light source so that light emission from the emitting surface passes through the optical lens;

a first monolithic detector structure located on a surface of the first optical lens by being grown thereon and being positioned along the emission axis of the optical light source and configured to detect optical output power of light emitted by the optical light source;

a periodic structure positioned along the emission axis of the optical light source following the first monolithic detector structure, the periodic structure being attuned to a particular wavelength within the optical wavelength range such that the periodic structure is substantially transmissive for light of the particular wavelength and variably less transmissive for light of different wavelengths outside of the optical wavelength range; and a second monolithic detector structure positioned along the emission axis of the optical light source following the periodic structure and configured to detect the wavelength of light emitted by the optical light source.

12. The optical transmitter of claim 11, wherein the periodic structure is included within an optical spectrum reshaper coupled to a second thermoelectric cooler configured to control the temperature of the optical spectrum reshaper, wherein a change in the temperature of the optical spectrum reshaper results in a change of the bandpass of the optical spectrum reshaper and the particular wavelength to which the periodic structure is attuned.

13. The optical transmitter of claim 11, wherein the second monolithic detector structure is coupled to a second optical lens following the optical spectrum reshaper.

14. The optical transmitter of claim 13, wherein the optical light source comprises a vertical cavity surface emitting laser, the first monolithic detector comprising:

a first metallization layer on the first optical lens or on an a buffer layer between the first optical lens and first metallization layer;

a PIN layer or junction on the first metallization layer; and a second metallization layer on the PIN layer or junction; and the second monolithic detector comprising:

a first metallization layer on the second optical lens or on an a buffer layer between the second optical lens and first metallization layer;

a PIN layer or junction on the first metallization layer; and a second metallization layer on the PIN layer or junction.

15. The optical transmitter of claim 14, wherein the optical transmitter is implemented in an SFP+ form factor optical transceiver that includes a transmit CDR chip for electrical signal equalization.

16. The optical transmitter of claim 11, further comprising an optical lens disposed between the optical light source and the periodic structure, wherein the axis of light emission of the optical light source passes through the optical lens and wherein the first monolithic detector structure is fabricated on an output surface of the optical lens along the axis of light emission.

17. The optical transmitter of claim 16, wherein the optical light source comprises a vertical cavity surface emitting laser or a distributed feedback laser and wherein the optical wavelength range is between 1520 nanometers and 1570 nanometers.

18. The optical transmitter of claim 11, wherein the first and second monolithic detector structures include one or more of: amorphous silicon germanium with carbon doping, and amorphous germanium with hydrogen doping.

19. The optical transmitter of claim 11, wherein photocurrents generated by the first and second monolithic detector structures are used in a feedback loop to determine and adjust an emission wavelength of the light emitted by the optical light source.

20. The optical transmitter of claim 11, further comprising a lookup table or calibration file indicative of the wavelength of light emitted by the optical light source depending on a ratio of photocurrents generated by the first and second monolithic detector structures.

\* \* \* \* \*

UNITED STATES PATENT AND TRADEMARK OFFICE
CERTIFICATE OF CORRECTION

PATENT NO. : 8,750,714 B2  
APPLICATION NO. : 13/316272  
DATED : June 10, 2014  
INVENTOR(S) : Daghighian et al.

Page 1 of 1

It is certified that error appears in the above-identified patent and that said Letters Patent is hereby corrected as shown below:

In the Specification

Column 4, Line 3, delete "monitoring." and insert -- monitoring; --, therefor.

In the Claims

Column 15, Line 54, in Claim 4, delete "or on an a" and insert -- or on a --, therefor.

Column 16, Lines 65-66, in Claim 14, delete "or on an a" and insert -- or on a --, therefor.

Column 17, Lines 6-7, in Claim 14, delete "or on an a" and insert -- or on a --, therefor.

Signed and Sealed this
Third Day of February, 2015

Michelle K. Lee
*Deputy Director of the United States Patent and Trademark Office*